United States Patent
Liao et al.

(10) Patent No.: US 8,207,065 B2
(45) Date of Patent: Jun. 26, 2012

(54) METHOD FOR FORMING A SHALLOW TRENCH ISOLATION

(75) Inventors: Chien-Mao Liao, Taipei Hsien (TW); Shing-Yih Shih, Taipei Hsien (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 590 days.

(21) Appl. No.: 11/968,621

(22) Filed: Jan. 2, 2008

(65) Prior Publication Data

US 2009/0029556 A1 Jan. 29, 2009

(30) Foreign Application Priority Data

Jul. 24, 2007 (TW) .............................. 96126909 A

(51) Int. Cl.
*H01L 21/31* (2006.01)
(52) U.S. Cl. ................ 438/703; 257/E21.249
(58) Field of Classification Search ........................ None
See application file for complete search history.

(56) References Cited

U.S. PATENT DOCUMENTS

| | | | |
|---|---|---|---|
| 5,087,586 A * | 2/1992 | Chan et al. | 438/429 |
| 6,200,881 B1 * | 3/2001 | Lou | 438/424 |
| 6,306,723 B1 * | 10/2001 | Chen et al. | 438/429 |
| 6,326,261 B1 * | 12/2001 | Tsang et al. | 438/243 |
| 6,355,529 B2 * | 3/2002 | Heo et al. | 438/270 |
| 6,660,599 B2 * | 12/2003 | Han et al. | 438/296 |
| 6,723,618 B2 * | 4/2004 | Meyer et al. | 438/429 |
| 7,118,988 B2 * | 10/2006 | Buerger et al. | 438/437 |
| 2002/0020887 A1 * | 2/2002 | Lee et al. | 257/374 |
| 2002/0072198 A1 * | 6/2002 | Ahn | 438/424 |
| 2003/0071321 A1 * | 4/2003 | Hong | 257/499 |
| 2003/0119240 A1 * | 6/2003 | Kanegae | 438/200 |
| 2004/0126990 A1 * | 7/2004 | Ohta | 438/435 |
| 2005/0023634 A1 * | 2/2005 | Yoon et al. | 257/506 |
| 2005/0167778 A1 * | 8/2005 | Kim et al. | 257/510 |
| 2007/0275523 A1 * | 11/2007 | Su et al. | 438/238 |
| 2007/0298583 A1 * | 12/2007 | Wu et al. | 438/424 |

FOREIGN PATENT DOCUMENTS

| | | |
|---|---|---|
| TW | 531833 | 5/2003 |
| TW | I229410 | 3/2005 |

* cited by examiner

*Primary Examiner* — Seahvosh Nikmanesh
(74) *Attorney, Agent, or Firm* — Winston Hsu; Scott Margo

(57) ABSTRACT

A method for forming a shallow trench isolation includes providing a substrate with a trench, a first liner layer and a second liner layer sequentially in the trench with a first oxide filling the trench, performing a first wet etching to remove part of the first oxide and part of the first liner layer to expose the substrate, performing a second wet etching to remove part of the second liner layer so that the second liner layer is lower than surface of the substrate, performing a third wet etching to remove part of the first oxide and part of the first liner layer, and filling the trench with a second oxide to form a shallow trench isolation.

13 Claims, 5 Drawing Sheets

METHOD FOR FORMING A SHALLOW TRENCH ISOLATION

BACKGROUND OF THE INVENTION

1. Field of the Invention

The present invention relates to a method for forming a shallow trench isolation (STI). In particular, the present invention relates to a method for forming an STI with ideal height of a liner.

2. Description of the Prior Art

As known by persons of ordinary skills in the art, the uniform control of the height of the silicon nitride liner in the STI structure is essential to the formation of the corner device. However, the current dry etching method is not ideal for forming the silicon nitride liner of uniform height.

If the level of the silicon nitride liner is too high after the etching, the high-density plasma would usually fail to fill the trench with an oxide and therefore voids appear.

On the other hand, if the level of the silicon nitride liner is too low, the spin-on-glass (SOG) layer in the trench will suffer the loss of its protection and is likely to be damaged by the following wet etching procedure. Neither outcome is desirable. Accordingly, a novel method is needed to form an STI with a liner of uniform and ideal height.

SUMMARY OF THE INVENTION

The present invention provides a method for forming an STI. The method takes the advantages of the wet etching to ideally control the etching intensity of the liner so as to obtain a liner of uniform and ideal height and completely solves the problem of uneven height of the liner by the dry etching.

The method for forming a shallow trench isolation includes providing a substrate with a trench in which a first liner layer and a second liner layer are sequentially formed with a first oxide filling the trench, performing a first wet etching to remove part of the first oxide and part of the first liner layer to expose the substrate, performing a second wet etching to remove part of the second liner layer so that the second liner layer is lower than the surface of the substrate, performing a third wet etching to remove part of the first oxide and part of the first liner layer, and filling the trench with a second oxide to form a shallow trench isolation.

These and other objectives of the present invention will no doubt become obvious to those of ordinary skill in the art after reading the following detailed description of the preferred embodiment that is illustrated in the various figures and drawings.

DETAILED DESCRIPTION

The present invention relates to a method for forming a shallow trench isolation. The method uses wet etching to control the etching intensity of the liner, so the liner of uniform and ideal height may be obtained, which overcomes the problems caused by the dry etching method.

Figure 1:
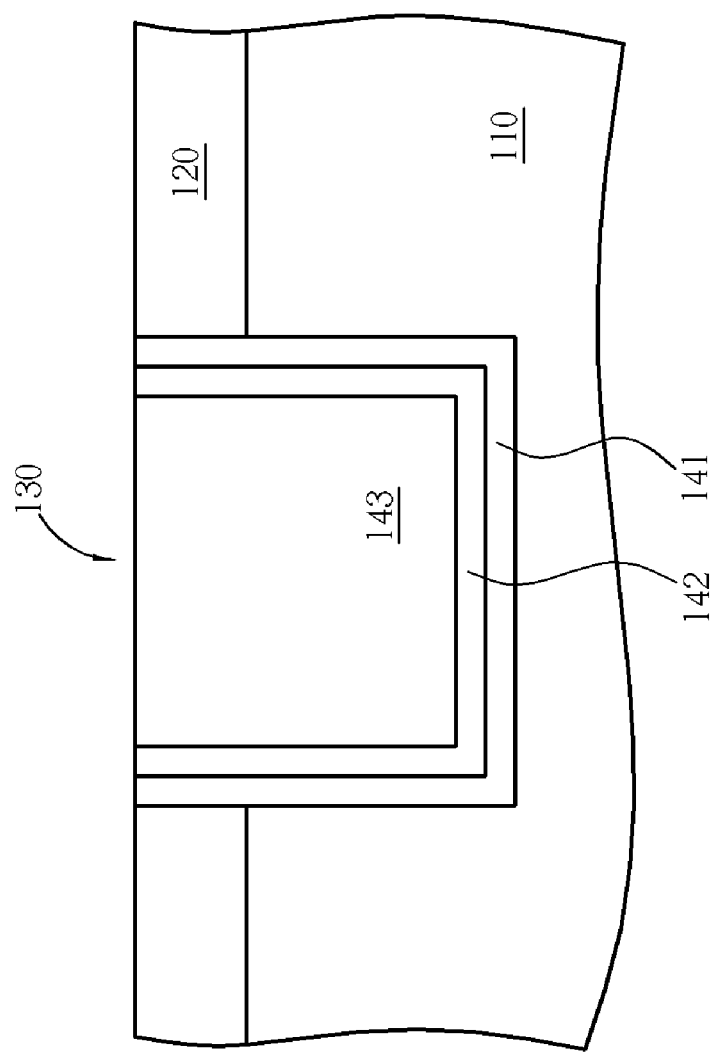
FIGS. 1-5 illustrate a preferred embodiment of the method for forming a shallow trench isolation of the present invention.

FIGS. 1-5 illustrate a preferred embodiment of the method for forming a shallow trench isolation of the present invention. First, as shown in FIG. 1, a substrate 110 is provided. The substrate 110 has a pad layer 120 and includes a trench 130. A first liner layer 141 and a second liner layer 142 are sequentially formed in the trench 130 which is filled with a first oxide 143.

The substrate 110 may be a semiconductor material, such as Si. On the other hand, the first liner layer 141 and the second liner layer 142 may include an oxide, such as silicon oxide, and a nitride, such as silicon nitride, respectively. Firstly, the pad layer 120 and the trench 130 may be formed by conventional methods, so that the trench 130 may have a depth about 2200 Å. Secondly, the first liner layer 141 may be formed by a furnace thermo-oxidation and have a thickness of about 130 Å-170 Å. Furthermore, the second liner layer 142 may be formed by a furnace oxidation and have a thickness of about 50 Å. In addition, the first oxide 143 may be an oxide, such as silicon oxide, formed by a SOG method.

Figure 2:
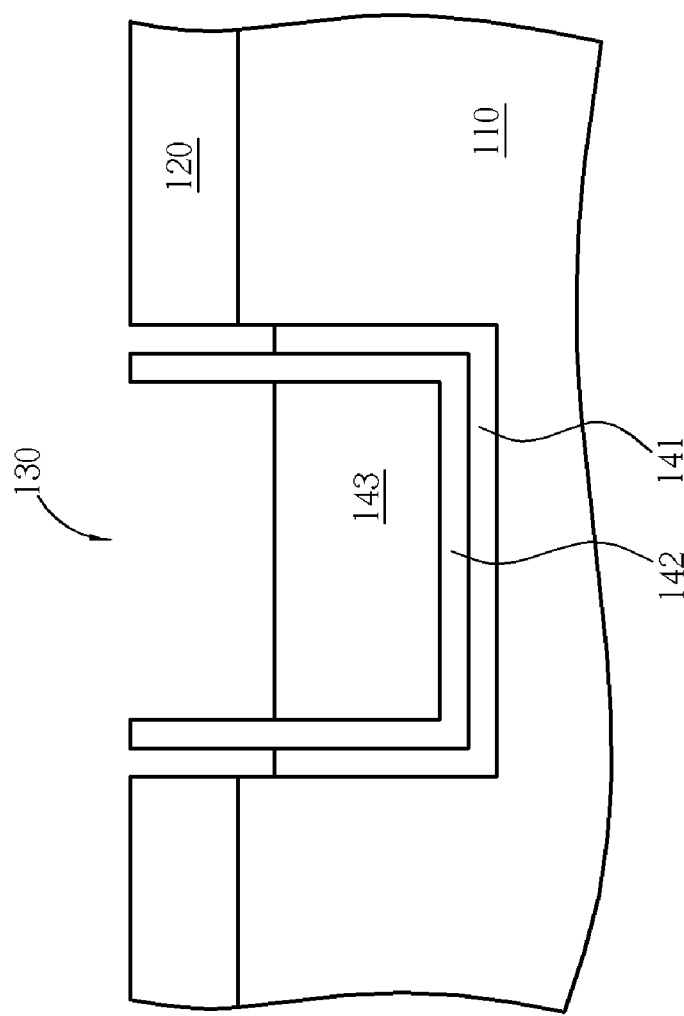

Then as shown in FIG. 2, a first wet etching is performed to consistently remove part of the first oxide 143 and part of the first liner layer 141 and to expose the substrate 110. Because the material of the first oxide 143 and the first liner layer 141 is different from that of the second liner layer 142, the first oxide 143 and the first liner layer 141 can be consistently removed by a selective wet etching.

If the first liner layer 141 is an oxide and the second liner layer 142 is a nitride, the first wet etching may be carried out by a 500:1 buffered oxide etching (BOE) method.

In addition, the quantity removed by the etching of the first oxide 143 and the first liner layer 141 depends on the device design.

Figure 3:
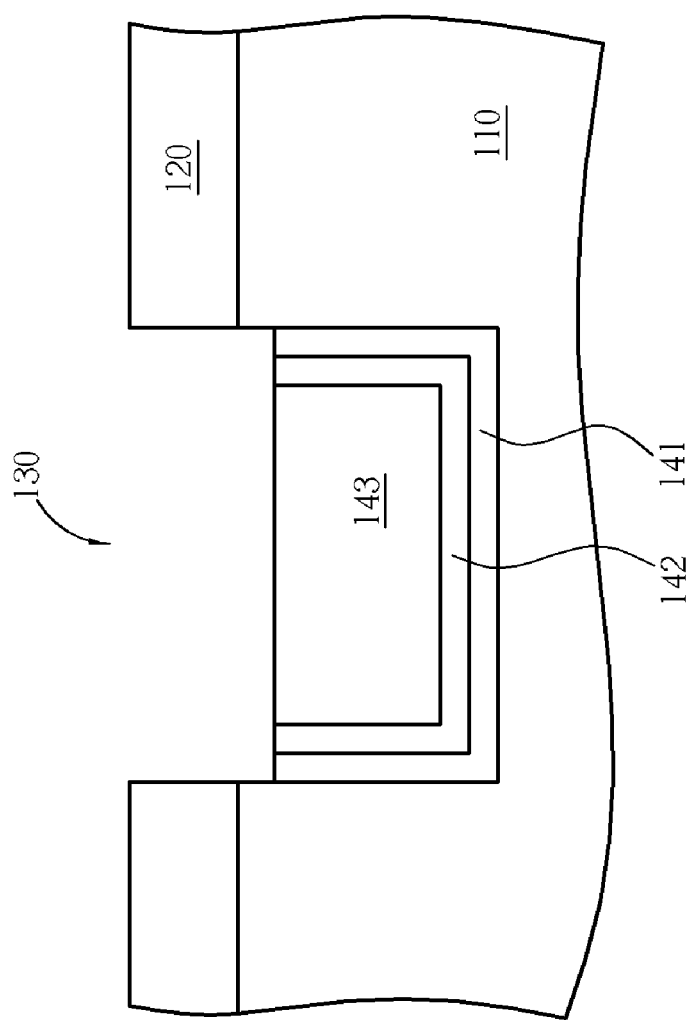

Later as shown in FIG. 3, a second wet etching is performed to selectively remove part of the second liner layer 142 so that the second liner layer 142 is lower than the surface of the substrate 110, or as low as the first liner layer 141. If the first liner layer 141 is an oxide and the second liner layer 142 is a nitride, the second wet etching may be carried out by hot phosphoric acid.

Figure 4:
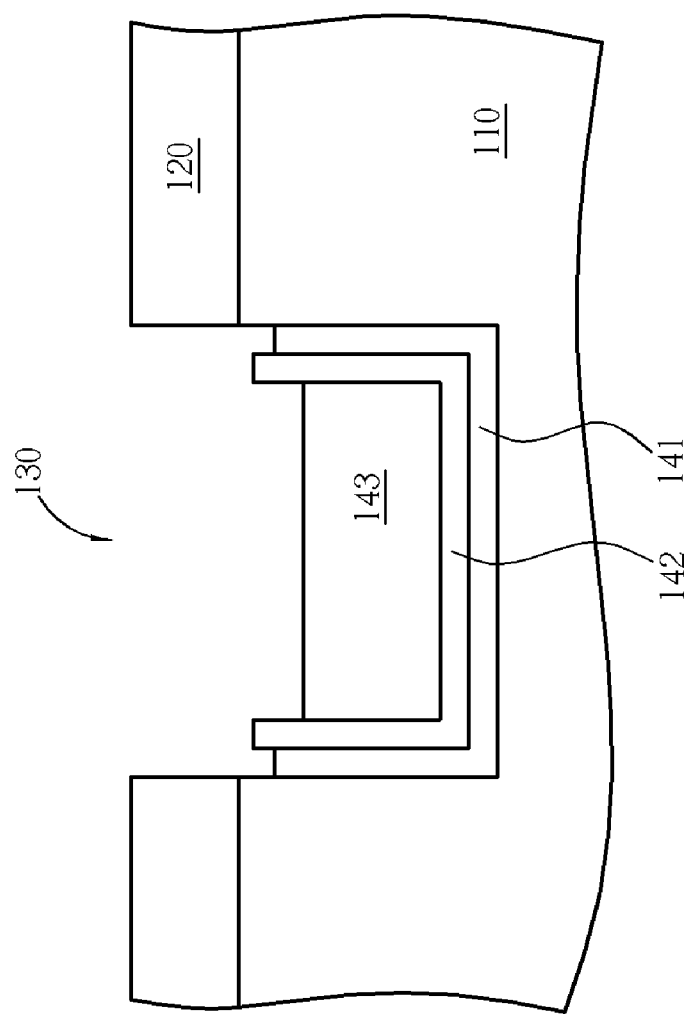

Afterwards as shown in FIG. 4, a third wet etching is performed to remove part of the first oxide 143 to a predetermined depth which should be lower than the second liner layer 142. In the meantime, part of the first liner layer 141 is removed, too. The third wet etching may be carried out by a condition the same as that of the first wet etching. The predetermined depth of the first oxide 143 carried out by the etching usually depends on the device design and the next step.

Figure 5:
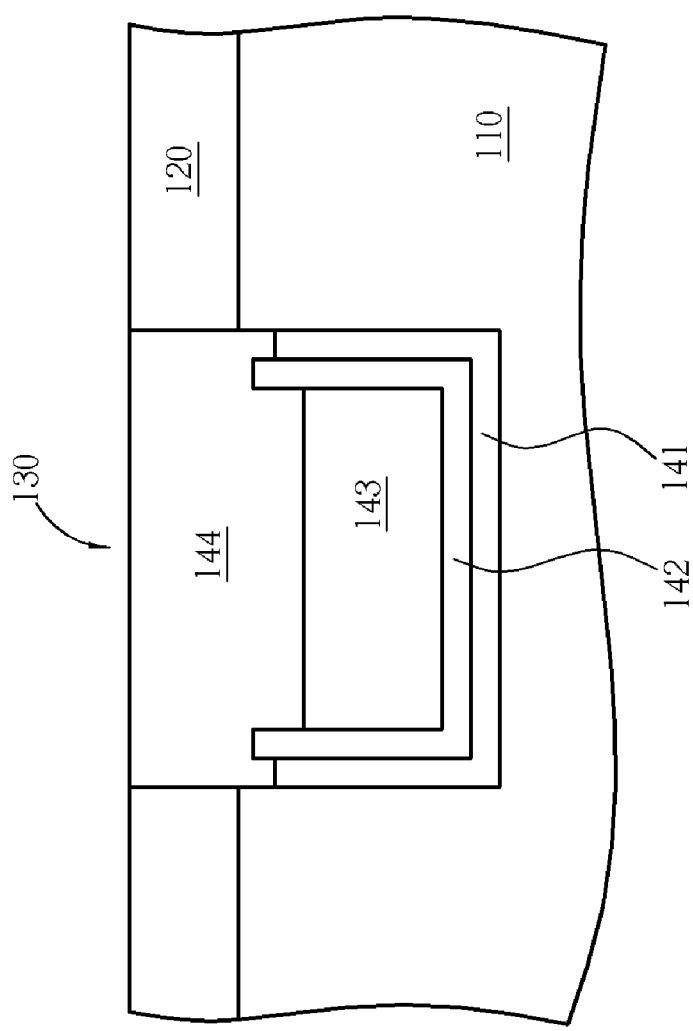

Then as shown in FIG. 5, the trench 130 is filled with a second oxide 144, such as silicon oxide, to form the shallow trench isolation of the present invention. The second oxide may be formed by a high-density plasma (HDP) method.

In the preceding step, the first oxide 143 should not be overly removed by the third wet etching so that voids may not occur to avoid that the second oxide 144 is incapable of filling a too deep trench.

After the STI is done, the second oxide 144 may undergo a chemical-mechanical-polishing (CMP) or the pad layer may be removed. Optionally, the method may be followed by the fabrication of the corner device. The details will not be discussed here.

Those skilled in the art will readily observe that numerous modifications and alterations of the device and method may be made while retaining the teachings of the invention.

What is claimed is:

1. A method for forming a shallow trench isolation, comprising:
   providing a substrate with a trench in which a first liner layer and a second liner layer are sequentially formed with a first oxide filling said trench;

performing a first wet etching to simultaneously and partially remove said first oxide and said first liner layer to expose said substrate;

after performing the first wet etching, performing a second wet etching to remove part of said second liner layer so that said second liner layer is lower than the surface of said substrate;

after performing the second wet etching, performing a third wet etching to remove part of said first oxide and part of said first liner layer; and filling said trench with a second oxide to form said shallow trench isolation.

2. The method for forming a shallow trench isolation of claim 1, wherein said substrate comprises Si.

3. The method for forming a shallow trench isolation of claim 1, wherein said first liner layer comprises silicon oxide.

4. The method for forming a shallow trench isolation of claim 1, wherein said first liner layer is formed by a furnace oxidation.

5. The method for forming a shallow trench isolation of claim 1, wherein said second liner layer comprises silicon nitride.

6. The method for forming a shallow trench isolation of claim 1, wherein said second liner layer is formed by a furnace oxidation.

7. The method for forming a shallow trench isolation of claim 1, wherein said first oxide comprises silicon oxide.

8. The method for forming a shallow trench isolation of claim 1, wherein said first oxide is formed by a spin-on-glass method.

9. The method for forming a shallow trench isolation of claim 1, wherein said first wet etching is carried out by a buffered oxide etching method.

10. The method for forming a shallow trench isolation of claim 1, wherein said second wet etching is carried out by hot phosphoric acid.

11. The method for forming a shallow trench isolation of claim 1, wherein said third wet etching is carried out by a buffered oxide etching method.

12. The method for forming a shallow trench isolation of claim 1, wherein said second oxide comprises silicon oxide.

13. The method for forming a shallow trench isolation of claim 1, wherein said second oxide is formed by a high-density plasma method.

* * * * *